United States Patent [19]
Sato

[11] Patent Number: 5,221,640
[45] Date of Patent: Jun. 22, 1993

[54] METHOD OF PRODUCING WIRING STRUCTURES FOR ELECTRONIC MATERIALS

[75] Inventor: Junichi Sato, Tokyo, Japan

[73] Assignee: Sony Corporation, Tokyo, Japan

[21] Appl. No.: 695,891

[22] Filed: May 6, 1991

[30] Foreign Application Priority Data

May 8, 1990 [JP] Japan .................................. 2-117917

[51] Int. Cl.$^5$ .................... H01L 21/24; H01L 21/465
[52] U.S. Cl. .................... 437/157; 437/190; 437/228
[58] Field of Search ........ 437/187, 190, 188, 191–200, 437/228; 204/192.3

[56] References Cited

U.S. PATENT DOCUMENTS

| | | | |
|---|---|---|---|
| 4,520,041 | 5/1985 | Aoyama et al. | 437/187 |
| 4,599,135 | 7/1986 | Tsunekawa et al. | 204/192.3 |
| 4,732,761 | 3/1988 | Machida et al. | 437/228 |
| 4,824,802 | 4/1989 | Brown et al. | 437/187 |
| 4,977,105 | 12/1990 | Okamoto et al. | 437/190 |
| 5,001,077 | 3/1991 | Sakai | 437/41 |
| 5,019,531 | 5/1991 | Awaya et al. | 437/193 |
| 5,106,786 | 4/1992 | Brady et al. | 437/228 |

*Primary Examiner*—Olik Chaudhuri
*Assistant Examiner*—Loc Q. Trinh
*Attorney, Agent, or Firm*—Hill, Steadman & Simpson

[57] ABSTRACT

Methods for the production of wiring structures are disclosed which are rendered suitable, particularly for use in semiconductors. An electrically conductive material of a selected class is refilled, in a specified manner and by the bias ECR-CVD system, into the connecting hole positioned on a substrate. This is conducive to voidless refilling of the connecting hole and also to thin lamination of the electrically conductive material on a wiring region.

17 Claims, 13 Drawing Sheets

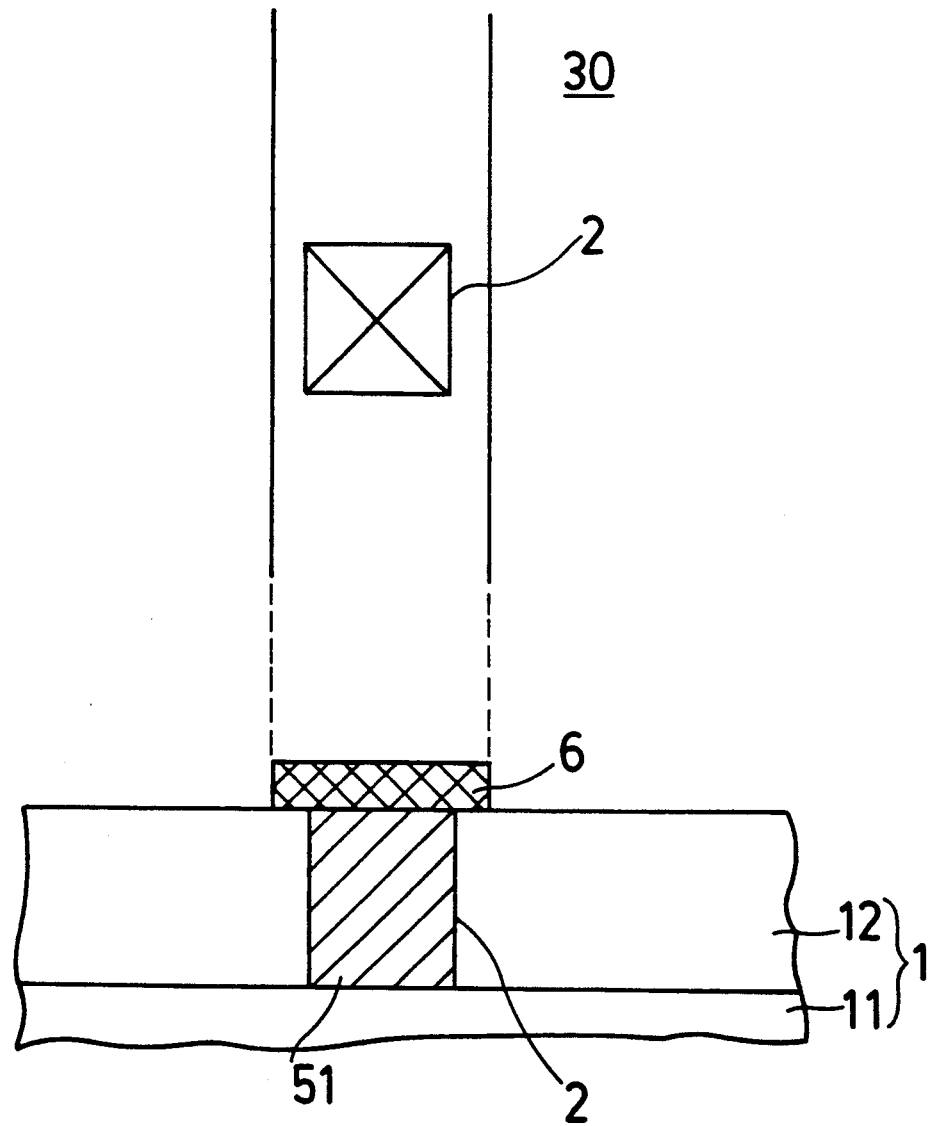

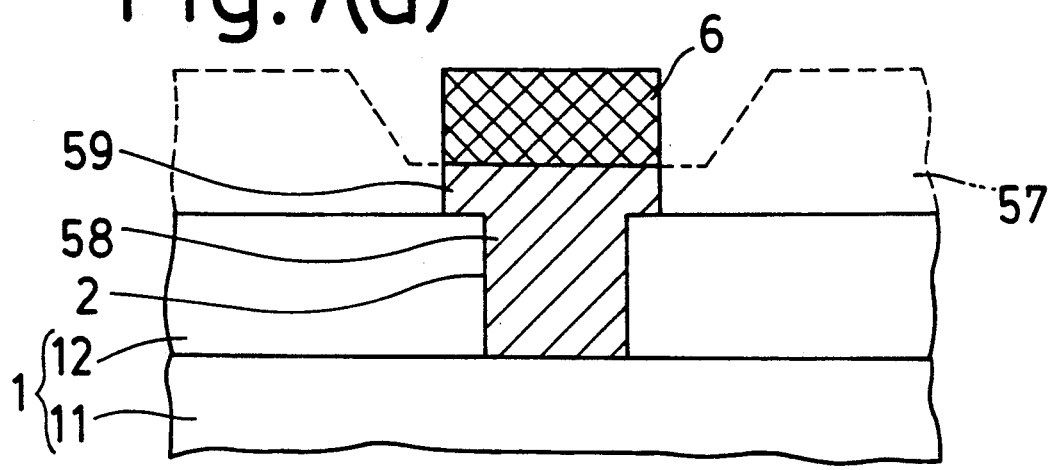
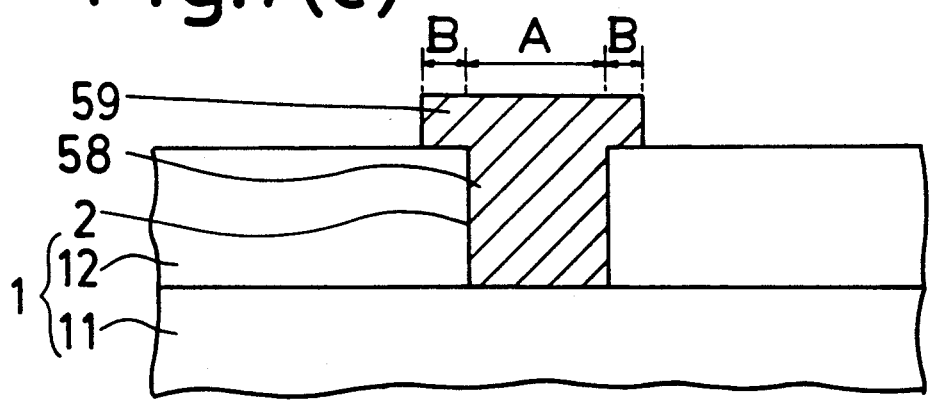

METHOD OF PRODUCING WIRING STRUCTURES FOR ELECTRONIC MATERIALS

BACKGROUND OF THE INVENTION

1. Field of the Invention

This invention is concerned with wiring structures for use in electronic materials and more particularly with a method of producing such wiring structures in which a specified step process is incorporated to refill, by the bias ECR-CVD system (electron cyclotron reasonance-chemical vapor deposition), a selected metal of electrical conductivity into a connecting hole or aperture on a substrate.

2. Description of the Prior Art

Great concern has been directed toward minuteness and compactness in industrial sectors of electronic materials provided with wirings, such as for example semiconductive devices. The disclosures associated with semiconductors of such a minute and compact type are found for instance in JP-A 64-23554 and JP-A 64-10629. To cope with this trend, wiring structures to be assembled with semiconductors are required to be of reduced width. Minuteness requirements are made necessary and profound for those wirings obtained by refilling connecting holes commonly called contact holes or bearing holes. A keen demand therefore has been voiced for a means of enabling an electrically conductive material to be refilled into narrower connecting holes with utmost reliability.

Taking the above problem in view, it has been proposed to use as electrically conductive materials high melting point metals of sufficient heat resistance and great reliability among which tungsten (W) is typified. The W metal may preferably be turned into the form of films by the blanket W-CVD system in which a total wiring area to be coated is covered with a W film and thereafter is subjected to patterning. This system allows simultaneously for refilling of the connecting hole and for formation of the ultimate wiring and moreover exhibits process stability at a high level in contrast to the selective CVD system also for use in hole refilling. With use of the blanket W-CVD system now mentioned, W can be made into films with low resistance as compared to the sputtering system. Details with respect to those systems are taught in JP-A-62-219945.

The above blanket W-CVD is not necessarily satisfactory as it is susceptible in some cases to insufficient refilling. This is true for instance where a W plug is derived by refilling the connecting hole on a substrate, coupled with formation of a wiring by depositing W over the surface of the substrate. In that instance the connecting holes, if of great aspect ratios and hence layer depths, cause, due to inadequate step coverage during CVD, porous or void refilling.

Alternatively, the bias ECR-CVD system is known for the formation of a blanket W so as to improve hole refilling. This prior system, however, leaves the problem that the blanket W tends to be held adversely thick on the flat surface of the substrate.

SUMMARY OF THE INVENTION

With the foregoing drawbacks of the prior art in view, the present invention seeks to provide a method for the production of wiring structures which enables refilling of an electrically conductive material into a connecting hole by means of the bias ECR-CVD system without involving objectionable voidness and adverse thickness of blanket W on a substrate.

The process according to the invention is applicable to producing wiring structures particularly for use in semiconductive devices and various other electronic materials.

In one aspect, the invention provides a method for the production of wiring structures which comprise preparing a substrate including a base plate and an interlaminar film having disposed therein a connecting hole containing a shoulder portion, and refilling an electrically conductive material into the connecting hole by the bias ECR-CVD system such that the deposition rate is equal to the etch rate at the shoulder portion.

In another aspect the invention seeks to provides a method of the production of wiring structures which comprises preparing a substrate including a base plate and an interlaminar film having disposed therein a connecting hole containing a shoulder portion, and refilling an electrically conductive material into the connecting hole by the bias ECR-CVD system such that the deposition rate is greater than the etch rate at the shoulder portion.

Many other objectives and advantages of the invention will be better understood from the following description taken in conjunction with the accompanying drawings.

BRIEF DESCRIPTION OF THE DRAWINGS

FIG. 3 is a plan view explanatory of the second embodiment; and

FIGS. 4(a) to 4(f), 5(a) to 5(f), 6(a) to 6(c), 7(a) to 7(e) and 8(a) to 8(f) are schematic cross-sectional views showing the process steps of third, fourth, fifth, sixth and seventh embodiments, respectively, provided in accordance with the present invention.

DETAILED DESCRIPTION OF THE INVENTION

Figure 1A:
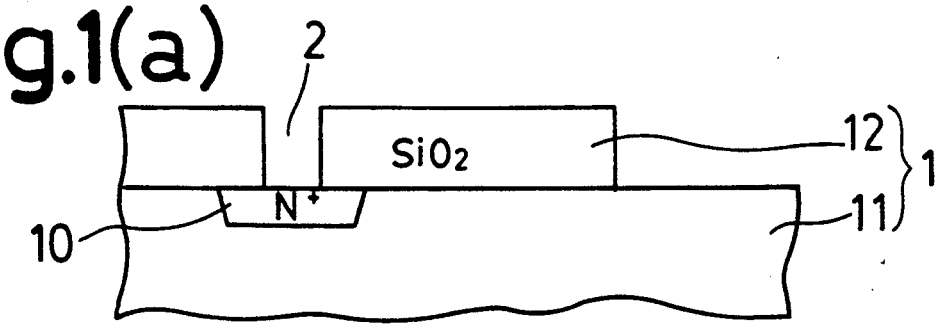
FIGS. 1(a) to 1(d) are schematic cross-sectional views of the process steps of a first embodiment provided in accordance with the present invention.

According to the method of the present invention an electrically conductive material is refilled, by the bias electron cyclotron resonance-chemical vapor deposition system (bias ECR-CVD system), into the connector or contacting holes or apertures provided with angled or shouldered portions and positioned on a substrate. Refilling should importantly be done with the deposition rate made equal to the etch rate at these shoulders so that voidless apertures are attained.

Also importantly, the rates of deposition and etching should be adjusted to laminate the electrically conductive material to a desired thickness on the substrate.

The invention will now be described by way of the following examples taken in connection with the drawing representations. These examples should be regarded as illustrative but not as restrictive.

EXAMPLE 1

A wiring structure shown in FIGS. 1(a) to 1(d) is constructed to be used for minute and compact semiconductors such as SRAMs of a 16- or 32-megabit class.

A substrate 1 is formed by a base plate 11 and an interlaminar layer 12 disposed thereon, an $SiO_2$ film exemplified herein. Designated at 2 is an aperture defined as a contacting hole in the interlaminar layer 12 and derived by patterning the layer 12 by the photolithography-etching system. An impurity area 10, an N+ area, is so arranged as to locate on the base plate 11 and communicate with the aperture 2.

An electrically conductive material, typified by tungsten (W), is thereafter refilled into the aperture 2 by the bias ECR-CVD system. In this instance, refilling of the aperture 2 and CVD of W on to the base plate 11 are carried out in a simultaneous manner. To form a layer of W, a bonding layer is generally disposed on the substrate 1 which is chosen from layers of TiN and sputtered W. Such a bonding layer has been arranged but not shown in this example.

The aperture 2 is allowed to refill with the W material at the shoulder or corner portion with the deposition and etching held at one and the same rate by means of the bias ECR-CVD system. This mode of refilling contributes greatly to voidlessness in the aperture 2. Further, one W layer 31a is formed transversely thick as a projection located upwardly from the substrate 1 at 13 in FIG. 1(b), coupled with formation of another W layer 31b of the same thickness as the layer 31a in a flat state in FIG. 1(b). The aperture 2 is set at not more than 1.79, preferably smaller than 1.78, in terms of the aspect ratio defined by the opening depth relative to the opening diameter. The aspect ratios exceeding 1.79 would cause objectionably void refilling in the contact hole 2 and adversely thick lamination of the W layer 31b on the flat site 14.

Figure 1B:
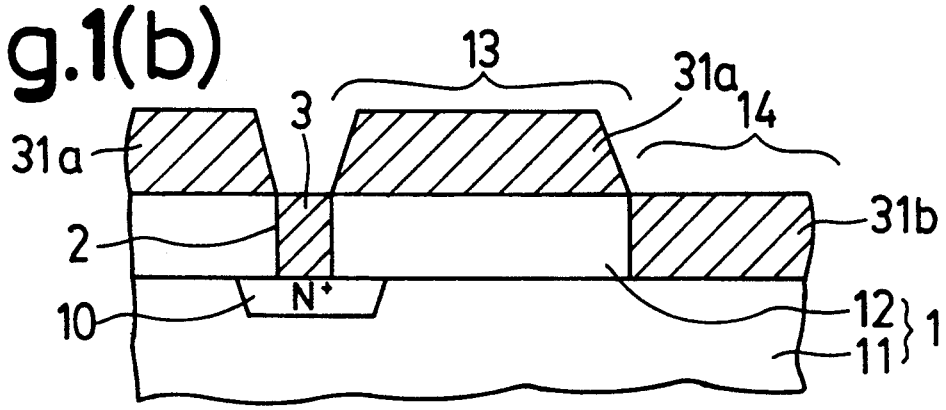
Figure 1C:
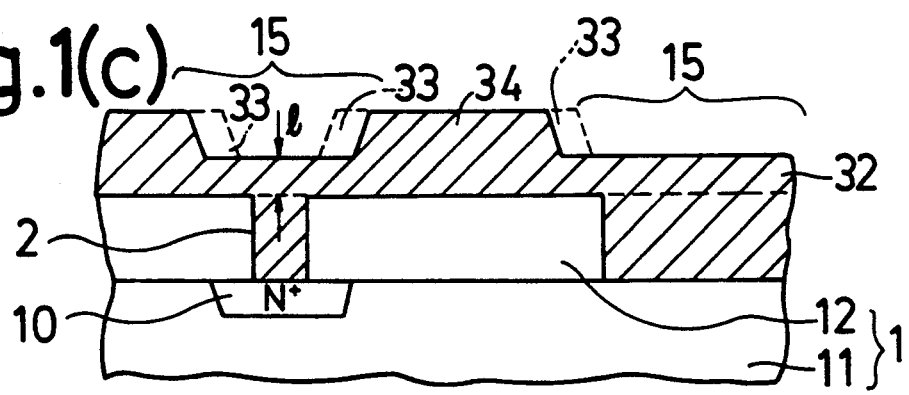
Figure 1D:
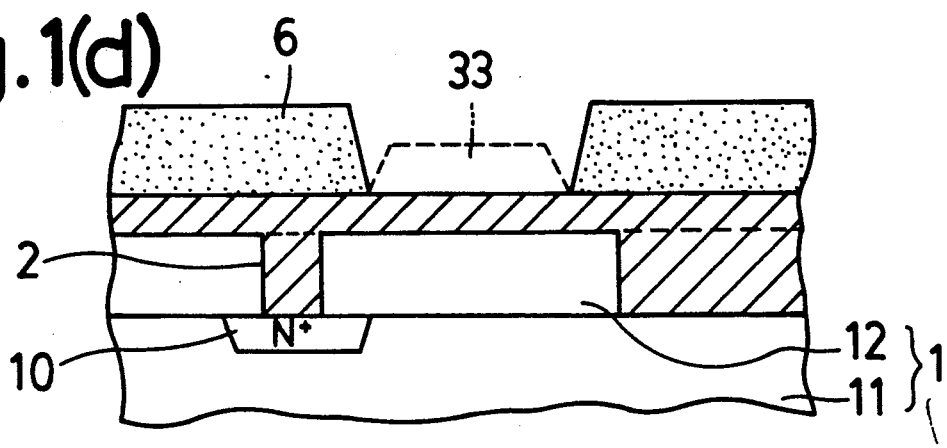

CVD is effected at a greater rate of deposition than of etching at a flat portion seen at 15 in FIG. 1(c) so that an electrically conductive layer 32 is formed by additionally laminating a film of W to a thickness of l as illustrated in FIG. 1(c). Because this is done with the etch rate set to be greater than the deposition rate at the shoulder portion, the layer 32 is detracted slightly toward the left and right sides as viewed at 33 in FIG. 1(c) due to the effect of leveling.

With the detracted parts 33 held in alignment with a resist, an electrically conductive film 34 of a thickness of l is disposed as corresponding to the projection 13 shown in FIG. 1(b). The resulting structure is viewed in FIG. 1(d) in which numberal 6 is used to refer to a resist and 33' to a W portion removed by masking with the resist.

By implementing this example, reliable refilling of the aperture even if relatively large in aspect ratio can be achieved without a thick lamination of the wiring layer being caused. Also advantageously, contact hole refilling and wiring layer formation are simultaneously possible.

EXAMPLE 2

This example also illustrates a wiring structure for application to highly compact semiconductors.

Figure 2A:
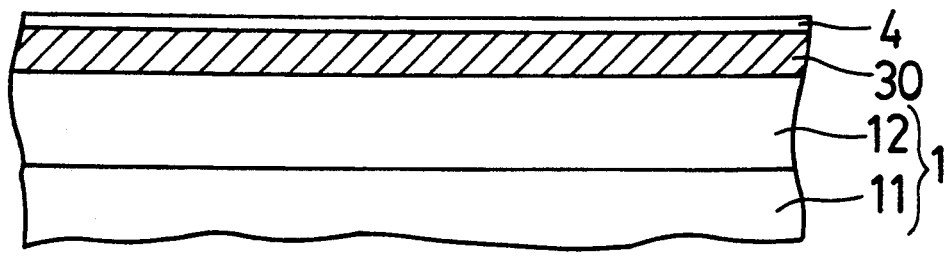
FIGS. 2(a) to 2(e) are views similar to FIGS. 1(a) to 1(d) but showing the process steps of a second embodiment.

A blanket W layer or wiring material layer 30 is laminated by the CVD system, such as of a thermal type in this example, over a substrate 1 made up of a silicone base plate 11 and an interlaminar $SiO_2$ film 12. The wiring layer 30 may be formed by the sputtering system as no specific coverage is required. Disposed on the layer 30 is a reflection-inhibiting film 4 of about 300 Å in thickness made of TiON or the like. The structure thus formed is seen in FIG. 2(a). To improve bonding of the wiring layer 30 to the substrate, a heat-resistant layer of TiN or sputtered W is interposed therebetween. Such an intermediate layer is omitted for simplicity in FIGS. 2(a) to 2(e).

Figure 2B:
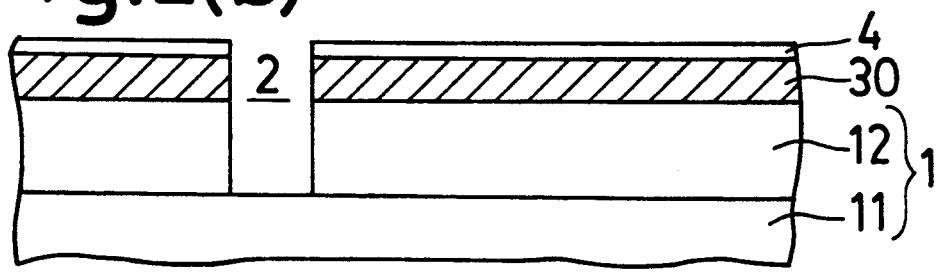

Patterning is subsequently done to form an aperture 2, namely a contacting or bearing hole, by the lithography system in common use in which both the wiring layer 30 and the interlaminar layer 12 are subjected to the reactive ion etching system (RIE). Where the aperture 2 is a contact hole, the intermediate layer 12 is caused at its extremely thin, last interface to undergo RIE under lowly ionized energy conditions to thereby prevent W against knocking on. This facilitates selection of the ratio of Si on the silicone plate 11, meaning that etching may employ a fluorine type gas under the above conditions. For instance, the reflection-inhibiting film 12 may be etched with a highly ionic gas such as $SF_6/Cl_2$ or $SF_6/N_2$, followed by RIE of the interlaminar film 12 at its last interface under low ionic energetic conditions. Thus a structure is obtained as represented in FIG. 2(b).

Figure 2C:
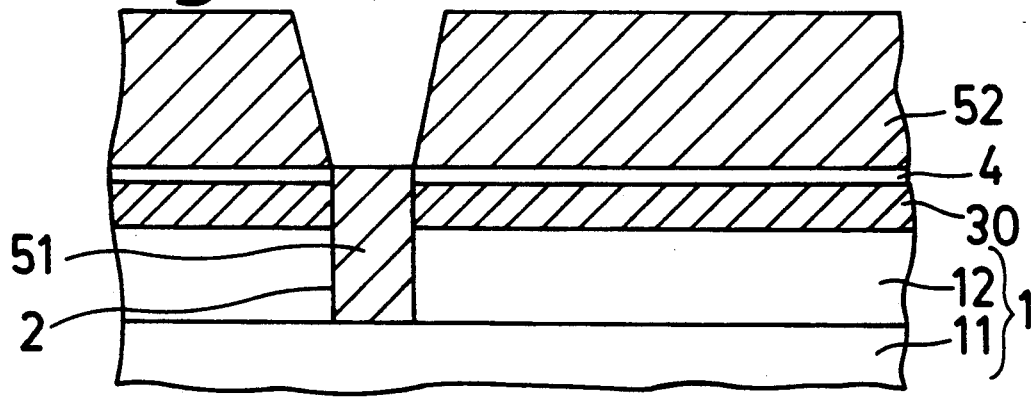
Figure 2D:
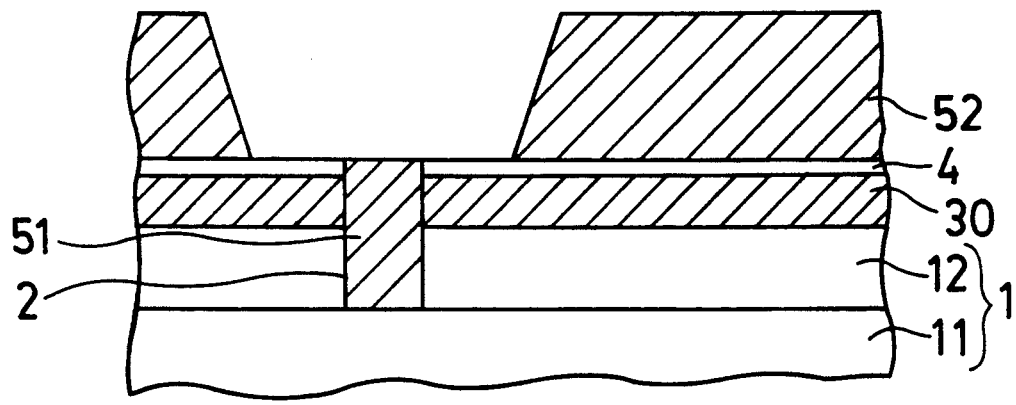
Figure 2E:
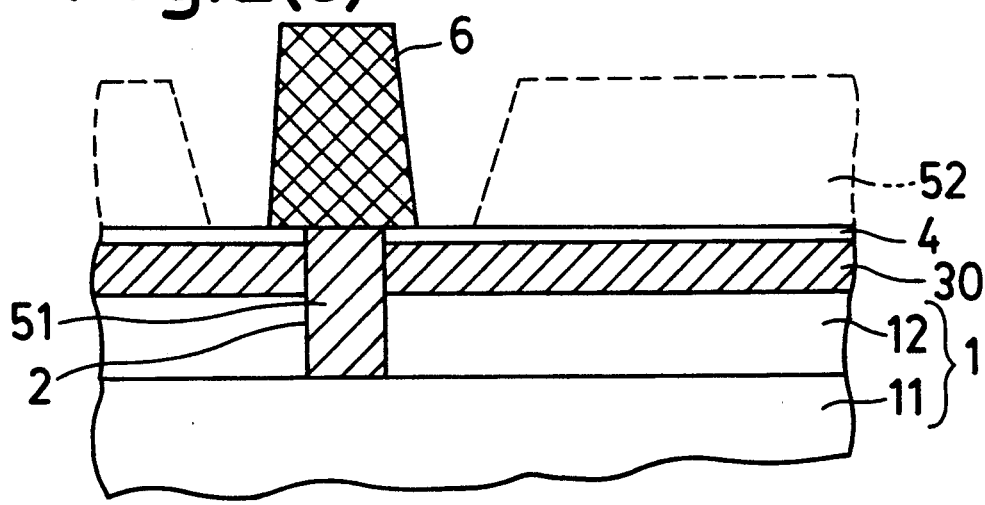

Refilling of the aperture 2 is performed by the bias ECR-CVD system for example with the deposition and etch rates made equal to each other at the aperture shoulder. A structure as seen in FIG. 2(c) is obtained in which the aperture 2 is refilled with an electrically conductive material 51 along with formation of an electrically conductive layer 52. The conditions are given below.

gas: $SiH_4/N_2O = 20/30$ SCCM
microwave: 1.0 kW
RF bias: 0.5 kW
pressure: $7 \times 10^{-4}$ Torr
magnetic field: 875 Gauss The electrically conductive layer 52 is then subjected to the bias ECR-CVD system so as to gain the effect of leveling. A structure viewed in FIG. 2(d) is thus obtained in which an electrically conductive material 51 refilled in the aperture 2 is separated from a similar material 52 located on TiO of the reflection-inhibiting layer 4. Leveling may be effected for example under the conditions summarized below.

gas $SiH_4/N_2O = 7.5/35$ SCCM
pressure: $7 \times 10^{-4}$ Torr
microwave: 1.0 kW
RF bias: 0.5 kW By means of patterning, a resist pattern 6 is formed which is used to mask and remove the relatively wide layer 52 as shown in dotted line in FIG. 2(e). Removal of the layer 52 may be made, for example, by wet etching in which a mixture of sulfuric acid and hydrogen peroxide is used or by plasma etching in which $F^+$ is used with its ionization reduced by an $SF_6$ gas.

Wiring or patterning is done on the layer 52 by the lithography system. Due to the presence of the film 4, patterning is free from structural deterioration by light reflectance. Although no reflection-inhibiting film is disposed over the aperture 2, no problem arises as the resist pattern 6 is patterned to cover the aperture 2 as better seen in FIG. 3.

Voidless refilling of the aperture 2 with an electrically conductive material, W in this example, is achieved by the bias ECR-CVD system, forming the wiring layer 30 and then the reflection-inhibiting film 4, and subsequently by leveling the layer 52 to thereby remove the layer 52. The film 4 acts to remove excess W material, leading to a good wiring pattern.

EXAMPLE 3

With reference to FIGS. 4(a) to 4(f), an electrically conductive layer or blanket W layer 31 is laminated, by the bias ECR-CVD system, on a substrate 1 constructed with a base plate 11 and an interlaminar layer 12 in which is disposed an aperture 2 such as a contact hole or bearing hole. Designated at 3 is W refilled in the aperture 2. Though not shown, a bonding film such as of TiN is located beneath the blanket W layer 31.

Figure 4A:
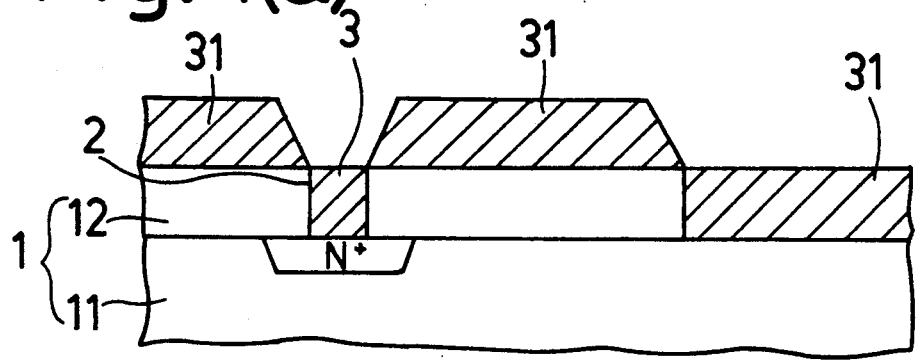
Figure 4B:
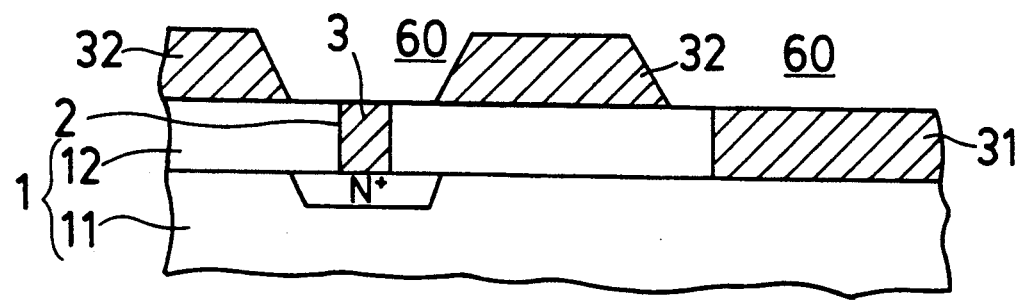

The W layer 31 is formed under the following conditions.

gas: $WF_6/SiH_4/H_2/Ar = 20/30/100/50$ SCCM
RF bias: 500 W
pressure: $7 \times 10^{-4}$ Torr
magnetic field: 875 Gauss The structure thus obtained is as viewed in FIG. 4(a). CVD is then done under the leveling conditions mentioned above with the result that a widely horizontal, electrically conductive layer 32 is separated from the W material 3 refilled in the aperture 2 as shown in FIG. 4(b).

Figure 4C:
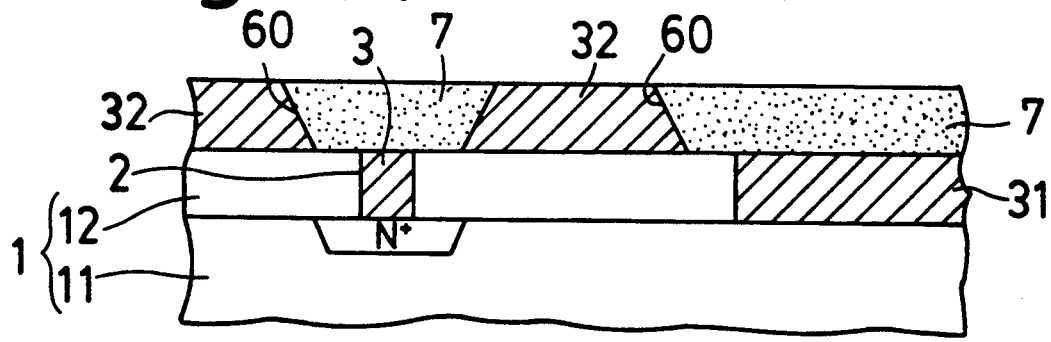
Figure 4D:
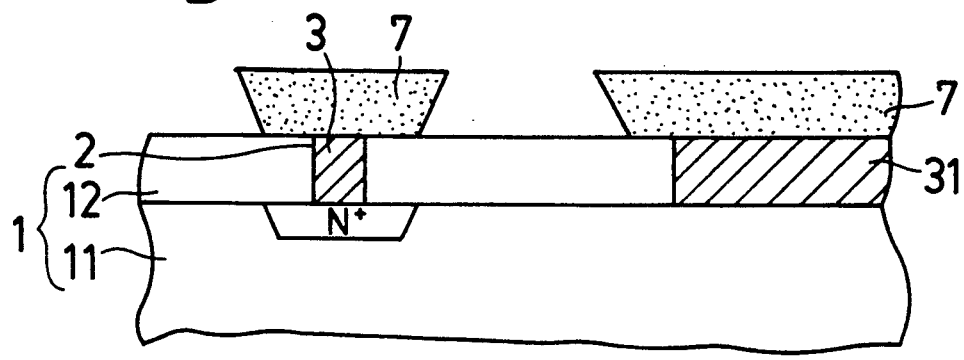

CVD is based on the conditions given below.

gas $SiH_4/N_2O = 7.5/35$ SCCM
pressure: $7 \times 10^{-4}$ Torr
microwave: 1 kW
RF bias: 0.5 kW As an etch-protective portion 7, $SiO_2$, is thereafter formed by the liquid phase CVD system in a recess 60 derived from leveling as shown in FIG. 4(c) in which $SiO_2$ is fully stored in the recess 60 owing to the liquid phase system. For this purpose, an admixture of TEOS-/$O_2$ may be employed as liquid phase CVD.

Isotropic etching is performed to remove the blanket W layer 32 not covered with the etch-protective portion 7 or $SiO_2$. There may be applied a wet etching system in which an $H_2SO_4/H_2O_2$ solution is used or a plasma etching system in which a fluorine or $F^+$ radical is used. In the case where $F^+$ is used, a bonding layer of TiN is preferred to be disposed which is unlikely to be etched and hence useful as a stopper. An etching stopper may be arranged where desired.

The blanket W layer 32 alone can be removed by isotropic etching as the leveling operation has previously been completed as shown in FIG. 4(b).

Figure 4E:
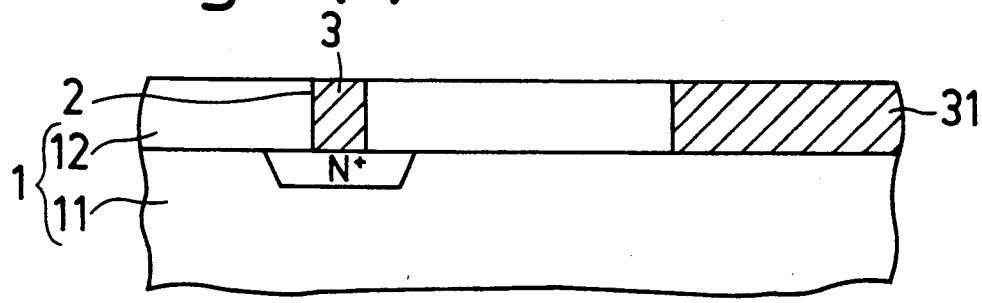

Subsequently, the etch-protective layer 7 or $SiO_2$ is removed as by RF. A bonding layer of TiN if present is useful as a stopper. A suitable etching stopper may if necessary be arranged. The resulting structure is as represented in FIG. 4(e).

Figure 4F:
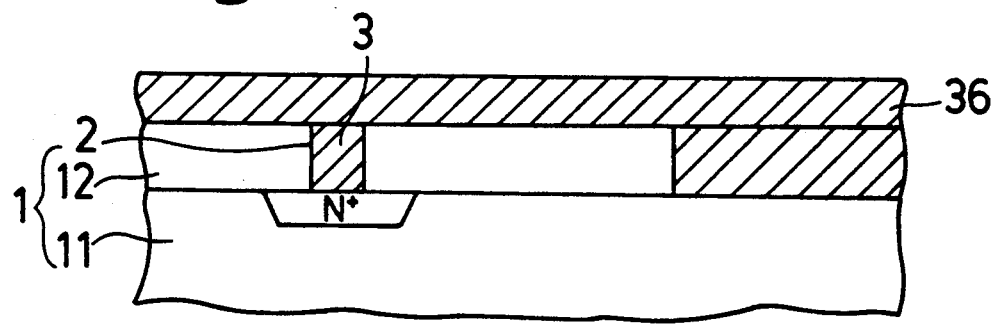

Blanket W is laminated as a wiring layer 36 on the substrate 1 for example by means of thermal CVD, PE-CVD, ECR-CVD or photo assisted CVD. Sputtering may be employed as refilling is not called for in this stage of process. The structure thus formed is illustrated in FIG. 4(f) in which blanket W is laid throughout the width of the substrate.

To effect aperture refilling leading to the refilled W 3 and wiring formation leading to the blanket W layer 31 by means of bias ECR-CVD system, this example permits easy removal of the widely horizontal, electrically conductive layer 32. The reason is due to use of the masking layer 7 resulting from CVD. Continuous processing is also made possible with a vacuum state maintained.

EXAMPLE 4

Figure 5A:
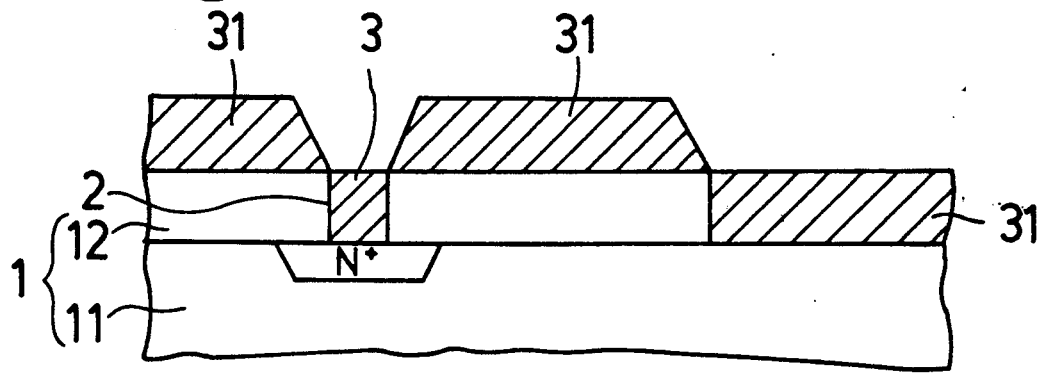

Reference is made to FIGS. 5(a) to 5(f). An electrically conductive layer or blanket W layer 31 is disposed, by the bias ECR-CVD system, on a substrate 1 made up of a base plate 11 and an interlaminar film 12 provided with an aperture 2 such as a contact hole or bearing hole. The W layer 31 is laid over a bonding layer such as TiN, not shown, located on a widely horizontal wiring surface of the substrate 1 and on the interlaminar layer 12. The aperture is refilled with W, simultaneously with formation of the layer 31, as seen at 3 in FIG. 5(a). The blanket W-CVD conditions are given below.

gas: $WF_6/SiH_4/H_2/Ar = 20/30/100/50$ SCCM
microwave: 1 kW
RF bias: 0.5 kW
pressure: $7 \times 10^{-4}$ Torr
magnetic field: 875 Gauss The resultant structure is as illustrated in FIG. 5(a). A widely horizontal, electrically conductive layer 32 is separated, by leveling, from the W material 3 refilled in the aperture 2.

Figure 5B:
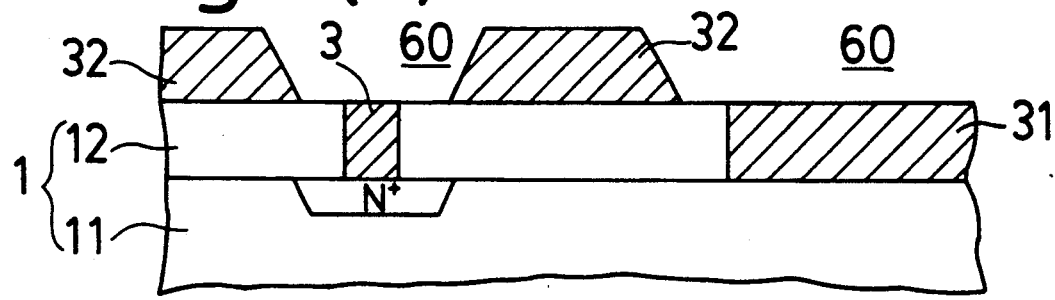
Figure 5C:
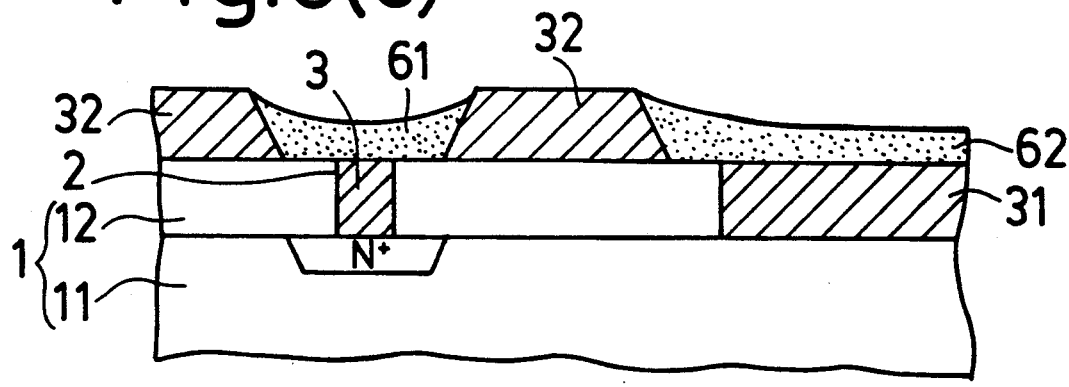

The leveling conditions are given below.

gas: $SiH_4/N_2 = 7.5/30$ SCCM
pressure: $7 \times 10^{-4}$ Torr
microwave: 1 kW
RF bias: 0.5 kW FIG. 5(b) illustrates a structure resulting from the operation of leveling in which the W material 3, the layer 31 and the layer 32 separate with one another. Coating of resists of low viscosity is accomplished, followed by isotropic etching by $O_2$ RIE in this example, so that the resists 61, 62 are held in recesses 60 formed in FIG. 5(b). The resultant structure is shown in FIG. 5(c) in which the resists are accommodated in the recesses alone.

The blanket W layer 32 not covered with the resists 61, 62 is removed by isotropic etching such as a wet etching system in which an $H_2SO_4/H_2O_2$ solution is used or a plasma etching system in which a fluorine radical $F^+$ is used. When $F^+$ is used, TiN is preferably located as a bonding layer, which TiN is rendered less etchable and hence utilized as a stopper. An etching stopper may be arranged when desired.

Figure 5D:
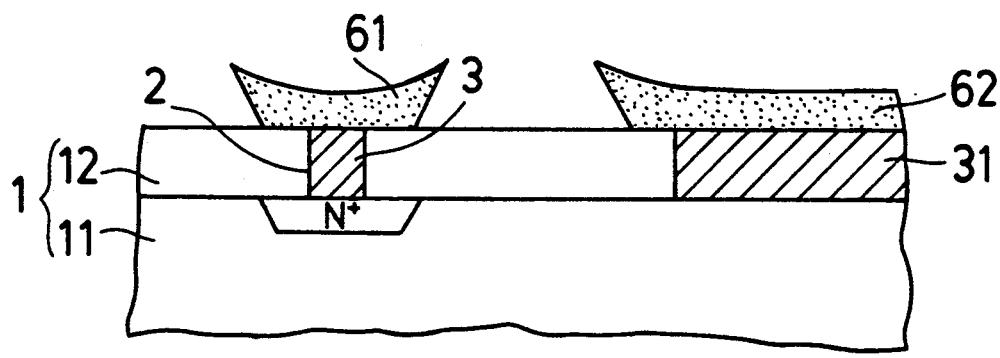

Because the operation of leveling has been completed as seen in FIG. 5(b), only the blanket W layer 32 can be removed after which a structure is formed as illustrated in FIG. 5(d).

Figure 5E:
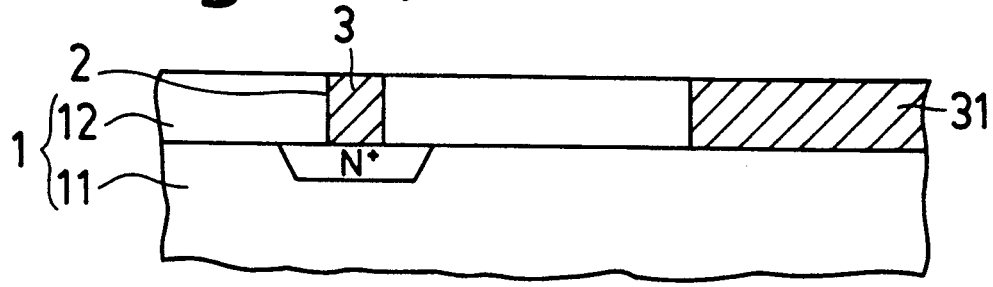
Figure 5F:
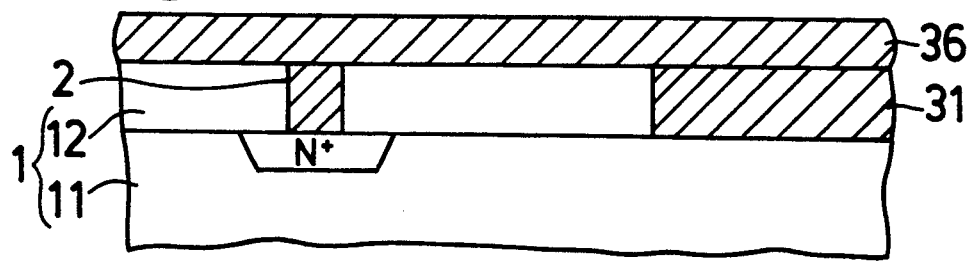

The resists 61, 62 are thereafter removed as by $O_2$ ashing. Thus there is obtained a structure as shown in FIG. 5(e).

A wiring layer 36 is formed over the substrate 1 as by thermal CVD, PE-CVD, ECR-CVD or photo assisted CVD. Sputtering is also feasible as refilling is not necessary at this stage. The structure thus obtained is provided with blanket W throughout the width of the substrate as viewed in FIG. 5(f).

In attaining refilling of the aperture 2 and formation of the blanket W layer 31 with use of the bias ECR-CVD system, it is made possible to easily remove the W material in a wide region as the blanket W layer 32 is masked with the resists 61, 62. To refill the recesses 60, a suitable leveling polymer may be used in place of the resists 61, 62. Such polymer should exhibit high fluidity even at low temperature and uniform surface upon coating, including for example styrene-chloromethylstyrene copolymer and siloxane-containing polymer.

Details with respect to the polymer are published in an issue of Jan. 4, 1990, Nikkan Kogyo Shimbun.

EXAMPLE 5

Figure 6A:
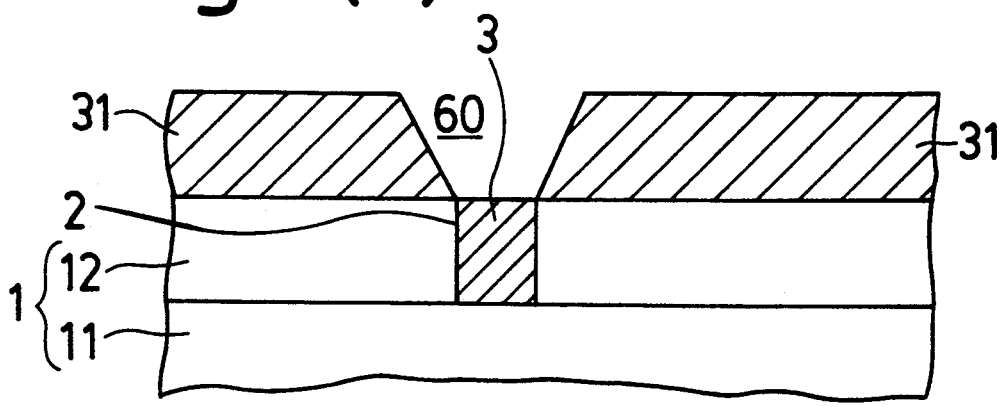
Figure 6B:
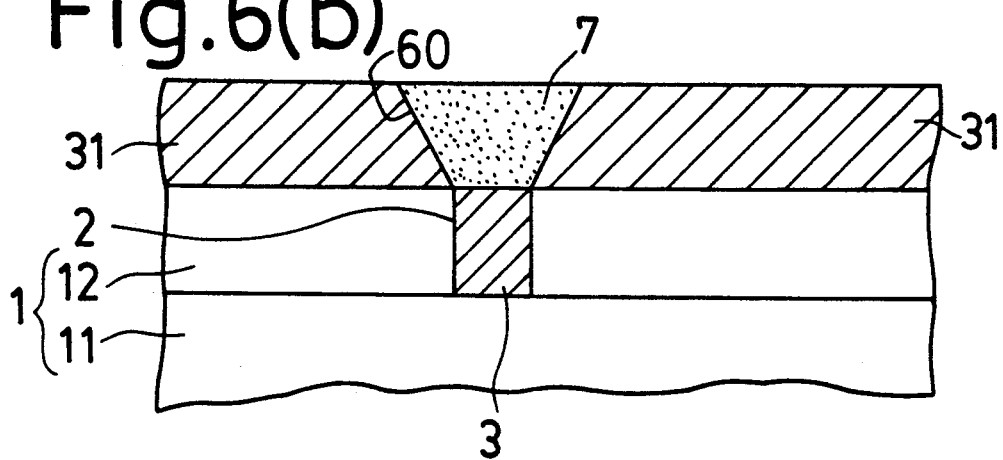
Figure 6C:
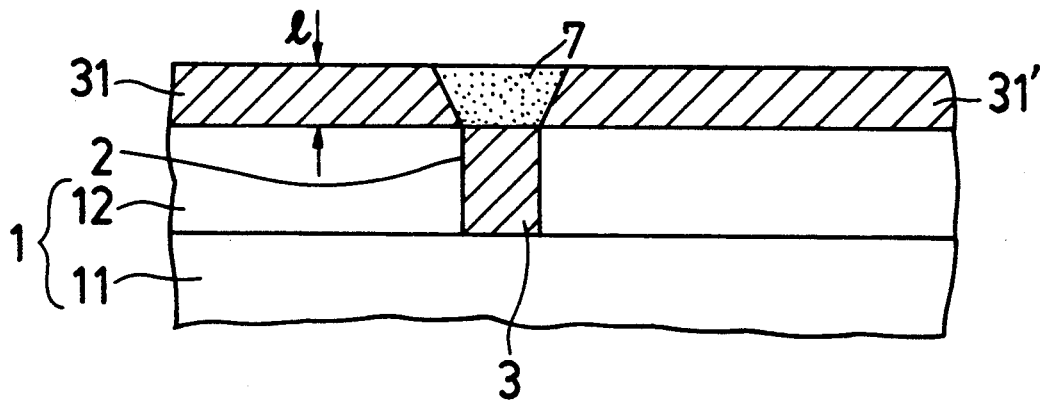

Reference is made to FIGS. 6(a) to 6(c). A contact hole or aperture 2 is disposed in a region on which to form a wiring on a substrate 1 comprised of a base plate 11 and an interlaminar film 12. The aperture 12 is refilled by deposition of blanket W with use of the bias ECR-CVD system. Refilling is done such that the etch rate is made equal to the deposition rate at an upper or shoulder portion of the aperture 2. The resulting structure is shown in FIG. 6(a) in which a recess 60 is formed in an electrically conductive or W layer 31. Seen at 3 in FIG. 6(a) is W deposited in the aperture 2.

Bias ECR-CVD is carried out under the conditions given below.

gas: $SiH_4/N_2O = 17.5/30$ SCCM
microwave: 1 kW
RF bias: 0.5 kW
pressure: $7 \times 10^{-4}$ Torr
magnetic field: 875 Gauss In the structure of FIG. 6(a) the recess 60 is refilled by liquid phase CVD system into a flat form as illustrated at 7 in FIG. 6(b), namely in a manner in which the W level is held in parallel relation to the surface of the layer 31 owing to the liquid phase system being used.

The layer 31 on its overall surface is caused to undergo anisotropic back etching so as to set a given wiring layer 31' at a predetermined thickness of l. The layer 31' is then patterned into a desired wiring structure.

To simultaneously achieve aperture refilling and wiring formation, refilling is completed by bias ECR-CVD, followed by leveling on liquid phase CVD and by subsequent back etching. This is highly capable of leveling and matching the electrically conductive layer or W wiring with utmost ease. Thick wiring is a serious disadvantage peculiar to the wiring formation by bias ECR-CVD. In this example a plurality of chambers may be arranged to continuously effect bias ECR-CVD, liquid phase CVD and RIE back etching in the order mentioned. Throughput is greatly improved.

EXAMPLE 6

Figure 7A:
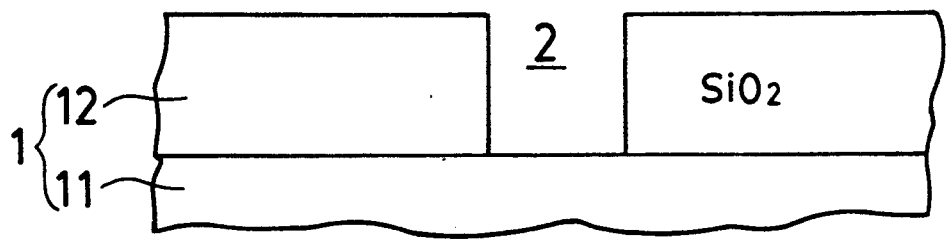

FIGS. 7(a) to 7(e) refer to this example. Laminated over a base plate 11 is an interlaminar or $SiO_2$ layer 12, and an aperture 2 such as a contact hole or bearing hole is contrived to be patterned by lithography. The layer 12 is subjected to RIE to thereby form an aperture 2. A substrate 1 is thus constructed as shown in FIG. 7(a).

By bias ECR-CVD, the aperture 2 is refilled with W as an electrically conductive material. A blanket W layer is formed in this example over a bonding layer not shown. The deposit rate is set to be slightly greater than the etch rate at the upper or shoulder portion of the aperture 2.

Figure 7B:
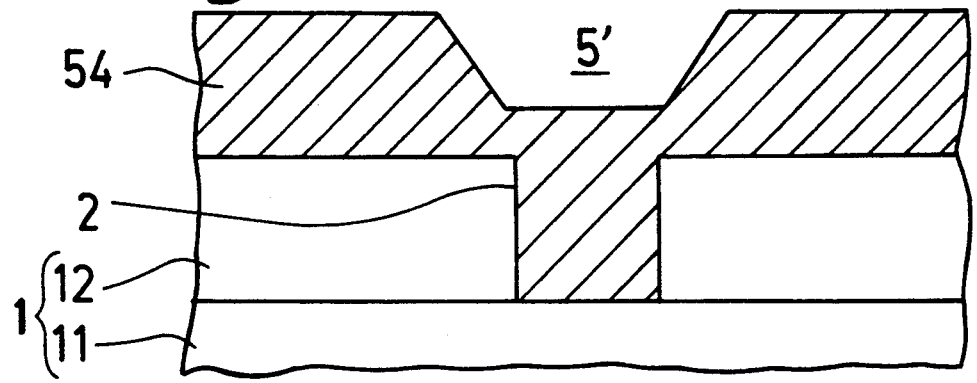
Figure 7C:
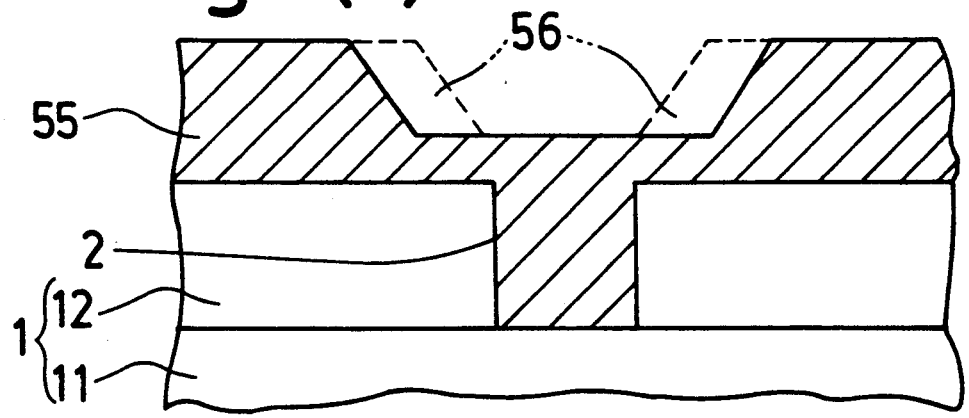

The following conditions are applied to arrangement of the blanket W layer gas: $WF_6/H_2/Ar = 10/40/20$ SCCM
microwave: 0.3 kW
pressure: $5 \times 10^{-3}$ Torr
magnetic field: 875 Gauss Through the above process steps a structure is obtained as shown in FIG. 7(b) in which an electrically conductive layer 54 is provided therein with a recess 5'. Leveling is done as in the foregoing examples so that the recess 5' is cut outwardly but without the layer 54 etched in the vertical and lateral directions. Illustrated in FIG. 7(c) is a structure derived by the operation of leveling in which the cut portions of the recess 5' are designated at 56 and laterally cut, W defined layers at 55.

Leveling is conducted under a set of conditions given below.

gas: $SiH_4/N_2 = 7.5/35$ SCCM
pressure: $7 \times 10^{-4}$ Torr
microwave: 1 kW
RF bias: 0.5 kW $SiO_2$ is patterned to form a resist pattern 6 as shown in FIG. 7(d) after which the W material is removed in a wide region at 57 as by a wet etching system in which is used an $H_2SO_4/H_2O_2$ solution or a plasma etching system in which is used a flourine radical $F^+$.

Upon removal of the resist pattern as treated above, a portion 59 is derived, as illustrated in FIG. 7(e), which portion corresponds to a size of Å of an aperture refilled portion 58 but has two outwardly marginal extensions B, B.

This leads to a wide selectively of wiring formation.

To form and refill the aperture 2 with an electrically conductive material, a W material in this example, the deposition rate is set to be slightly greater than the etch rate at a shouldered or angled portion of the aperture 2. Further, leveling is done by removing the W material at a wide region. This occurs in voidless fashion and a stable refilling of the aperture 2 results at a slightly higher rate of deposition than of etching without the aperture becoming cut at its angled portion. The marginal portions B, B are advantageous in matching in wiring formation.

EXAMPLE 7

This example is explained with reference to FIGS. 8(a) to 8(f). An aperture 2 such as a contact hole or bear hole is formed by patterning an interlaminar layer 12 with use of lithography, which layer is used to constitute a substrate 1. Formation of the aperture 2 results from RIE of the layer 12, leading to a structure of FIG. 8(a).

Figure 8A:
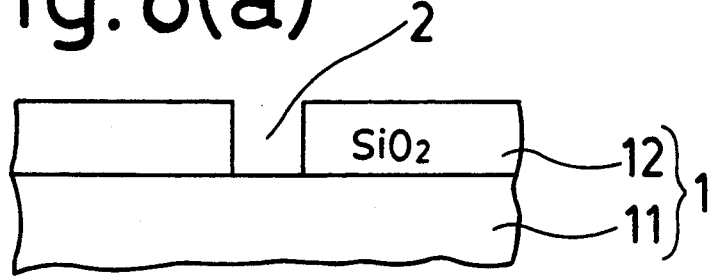
Figure 8B:
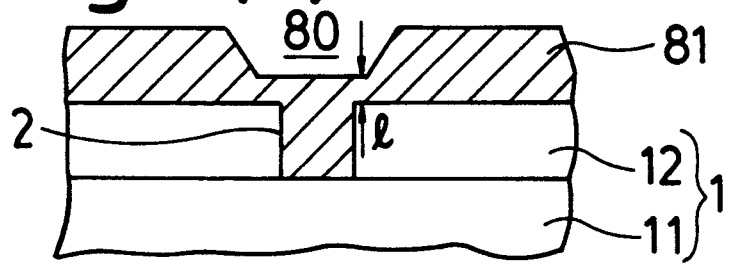

A W material is deposited by the bias ECR-CVD system so as to form an electrically conductive layer 31. CVD is effected at a higher rate of deposition than of etching, as for instance under the following conditions.

gas: $WF_6/H_2/Ar = 10/40/20$ SCCM
microwave: 0.8 kW
RF bias: 0.3 kW
pressure: $5 \times 10^{-4}$ Torr
magnetic field: 875 Gauss As illustrated in FIG. 8(b) a structure is obtained in which a recess 80 is deposed over the aperture 2. Subsequent leveling allows the layer 81 to detract at its left and right sides. This condition is seen at 82 in FIG. (c).

The leveling conditions may be set below.

gas $SiH_4/N_2 = 7.5/35$ SCCM
pressure: $7 \times 10^{-4}$ Torr
microwave: 1 kW
RF bias: 0.5 kW Leveling compensates for margins to be taken in the subsequent resist matching as shown in FIG. 8(e). When it is found desirable, this step of leveling may be supplemented. An electrically conductive layer 84 is removed by anisotropic etching such that it is made coextensive with the surface of the aperture 2 as seen in FIG. 8(d). In this case an electrically conductive material or W 85 is held in the aperture 2 alone. Designated at 84 is a portion anisotropically etched and at 83 is an electically conductive layer left after etching.

Etching is conducted under the conditions given below.

gas: SF$_6$/N$_2$=30/28 SCCM
pressure: 15 m Torr
applied electric power: 0.24 W/cm$^2$ The resist is patterned to form a resist pattern 6 which is then used to mask for etching, thereby forming a structure as shown in FIG. 8(e) in which is removed the layer 83 positioned widely on the aperture 1. A portion so removed is designated at 86 in FIG. 8(e). Etching removal of the W material may be done as by a wet etching system in which an H$_2$SO$_4$/H$_2$O$_2$ solution is used or a plasma etching system in which a fluorine radical F$^+$ is used.

Figure 8C:
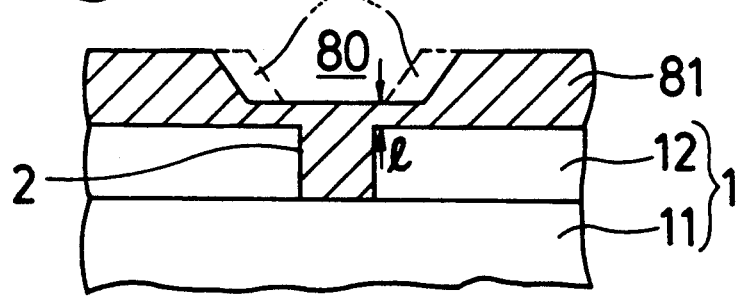
Figure 8D:
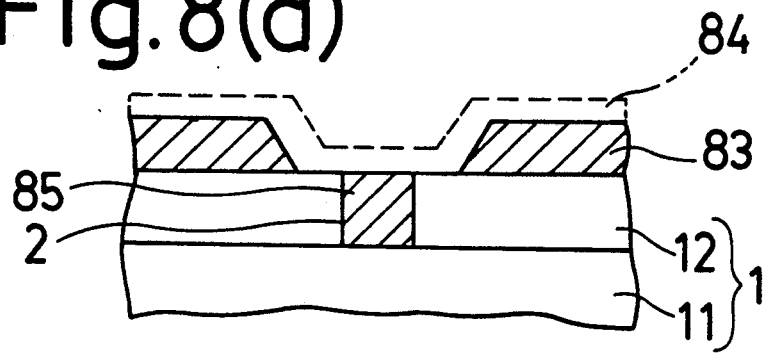
Figure 8E:
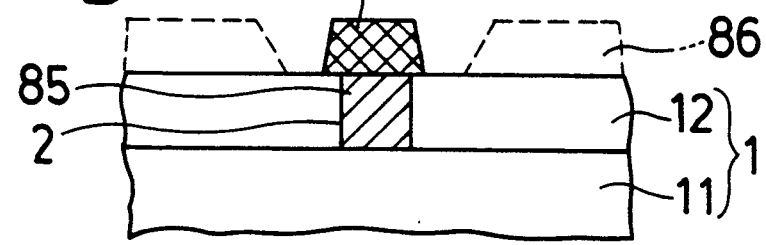

The masking margins of the resist are thus provided by refilling, leveling and etching as shown in FIGS. 8(b) to 8(d). A wiring 9 is made on the aperture 1 as viewed in FIG. 8(f). Voidless refilling of the aperture 2 is attained upon formation of the W layer by bias ECR-CVD. Refilling is stably done without the aperture 2 being scrapered since the deposition rate is set to be slightly greater than the etch rate at the shoulder of that aperture. Moreover, the electically conductive material is removed with utmost ease at a wider region on the substrate 1. This is due to the layer 83 being removable after etching of the material 85 substantially to the same level as the surface of the aperture 2. Mask matching is also possible with a sufficient degree of margin.

Figure 8F:
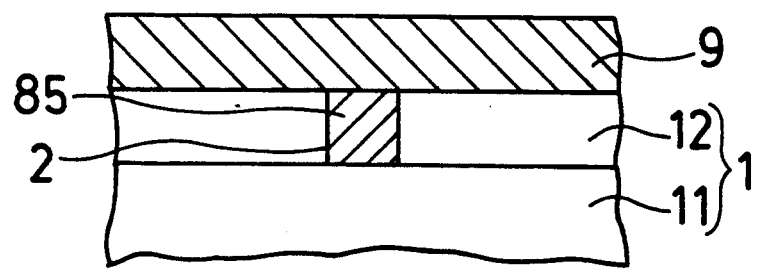

The wiring 9 of FIG. 8(f) may be modified to have a thickness other than the l thickness shown in FIGS. 8(b) or 8(c). Upon refilling of the recess 80 with the resist, etch backing is conducted at a rate of 1:1 of resist to W to thereby etch the resist together with the W material of a thickness specified above, leaving a W material of the l thickness.

Although various minor changes and modifications might be proposed by those skilled in the art, it will be understood that I wish to include within the claims of the patent warranted hereon all such changes and modifications as reasonably come within my contribution to the art.

What is claimed is:

1. A method for production of wiring structures, comprising the steps of:
   providing a substrate and an interlaminar layer on top of the substrate;
   creating an aperture through the interlaminar layer down to a surface of the substrate, said aperture having a shoulder portion;
   refilling an electrically conductive material into said aperture by a bias electron cyclotron resonance-chemical vapor deposition (bias ECR-CVD) such that a deposition rate is substantially equal to an etch rate at least at said shoulder portion, and during said refilling said electrically conductive material also forming alongside said aperture on said interlaminar layer for use as a wiring layer;
   conducting a CVD at a greater rate of deposition than of etching above said aperture so as to form a flat conductive portion thereabove while setting an etch rate greater than a deposition rate above said shoulder portion at both sides flanking the flat portion; and
   applying a resist as a mask in said flat portion above said aperture and removing portions of the wiring layer extending above the flat portion so that a substantially flat upper face results on the wiring layer.

2. A method according to claim 1 wherein said substrate has a contact region at a base of said aperture.

3. A method according to claim 2 wherein said contact region comprises a region of differing conductivity type than the substrate in the substrate.

4. A method according to claim 1 wherein the electrically conductive material comprises tungsten (W).

5. A method according to claim 1 wherein a bonding layer is deposited on the substrate prior to deposition of the wing layer.

6. A method for production of wiring structures, comprising the steps of:
   providing a substrate and an interlaminar layer on top of the substrate;
   applying a blanket electrically conductive wiring layer onto the interlaminar layer by CVD deposition;
   providing a reflection-inhibiting film on the wiring layer;
   providing an aperture down through the reflection-inhibiting film, blanket wiring layer, and interlaminar layer down to a surface of the substrate;
   refilling the aperture by a bias ECR-CVD with deposition and etch rates made substantially equal to each other at a shoulder of the aperture, electrically conductive material also being deposited on the reflection inhibiting film during said refilling;
   by a bias ECR-CVD, effecting a levelling of the conductive material so as to remove portions of the electrically conductive material surrounding the aperture and provide a levelled recess region above the aperture;
   applying a resist pattern as a mask at the levelled region on top of and surrounding the aperture; and
   removing by etching the electrical conductive material above the reflectioninhibiting film.

7. A method according to claim 6 wherein said substrate has a contact region at a base of said aperture.

8. A method according to claim 6, wherein the electrically conductive material comprises tungsten.

9. A method for production of wiring structures, comprising the steps of:
   providing a substrate;
   providing an interlaminar layer on the substrate;
   providing an aperture through the interlaminar layer down to surface of the substrate;
   refilling with an electrically conductive material into the aperture by a bias ECR-CVD method and wherein at a shoulder of the aperture deposition and etching rates are held substantially equal, electrically conductive material also being deposited on the interlaminar layer during said refilling;
   by a bias ECR-CVD, effecting a levelling of the conductive material so as to remove portions of the electrically conductive material surrounding the aperture and provide a levelled recess region above the aperture;
   applying an etch protection layer within the levelled recess region above the aperture;
   isotropically etching the electrically conductive layer so as to remove it from a top of the interlaminar layer;
   removing the etch protection layer above the aperture; and applying a blanket electrically conductive layer as a wiring layer on the interlaminar layer and in contact with the refilled aperture.

10. A method according to claim 9 wherein said substrate has a contact region at a base of said aperture.

11. A method according to claim 9 wherein the electrically conductive material comprises tungsten (W).

12. A method for production of wiring structures, comprising the steps of:

providing a substrate and an interlaminar layer on top of the substrate;

creating an aperture through the interlaminar layer down to a surface of the substrate;

by a bias ECR-CVD, refilling the aperture with an electrically conductive material and also depositing electrically conductive material alongside the aperture on the interlaminar layer, a deposition rate being set slightly greater than an etch rate at a shoulder portion of the aperture, a recess being formed in the electrically conductive layer above the refilled aperture, said recess having a flat bottom portion spaced from a top of said aperture;

cutting the recess outwardly in a levelling step;

applying a resist pattern in the levelled out recess above the aperture; and removing outer portions of the electrically conductive layer from a top surface of the interlaminar layer but with a marginal extension of the conductive layer extending slightly beyond the refilled aperture being left on the interlaminar layer.

13. A method according to claim 12 wherein said substrate has a contact region at a base of said substrate.

14. A method according to claim 12 wherein the electrically conductive material comprises tungsten (W).

15. A method for production of wiring structures, comprising the steps of:

providing a substrate and an interlaminar layer on top of the substrate;

creating an aperture through the interlaminar layer down to a surface of the substrate;

in a bias ECR-CVD, forming electrically conductive material in the aperture so as to refill the aperture and also forming on a top surface of the interlaminar layer an electrically conductive layer simultaneously with the refilling, the CVD being affected at a higher rate of deposition than of etching so that a recess results in the electrically conductive layer having a bottom thereof spaced from and above the refilled aperture;

levelling out the recess so as to detract at left and right sides of the recess;

removing a portion of the electrically conductive layer at said bottom of the recess by an anisotropic etching down to the refilled aperture;

applying a recess pattern to cover the refilled aperture;

removing outwardly lying portions of the electrically conductive layer on the interlaminar layer; and applying an electrically conductive material as a wiring layer on top of the interlaminar layer and in contact with the refilled aperture.

16. A method according to claim 15 wherein said substrate has a contact region at a base of said substrate.

17. A method according to claim 15 wherein the electrically conductive material comprises tungsten (W).

* * * * *